United States Patent
Igaki et al.

(10) Patent No.: US 7,679,474 B2
(45) Date of Patent: Mar. 16, 2010

(54) SURFACE ACOUSTIC WAVE RESONATOR, AND SURFACE ACOUSTIC WAVE FILTER

(75) Inventors: Tsutomu Igaki, Hyogo (JP); Kazunori Nishimura, Kyoto (JP); Kazuo Ikeda, Osaka (JP); Ken Matsunami, Osaka (JP)

(73) Assignee: Panasonic Corporation, Osaka (JP)

( * ) Notice: Subject to any disclaimer, the term of this patent is extended or adjusted under 35 U.S.C. 154(b) by 941 days.

(21) Appl. No.: 10/580,915

(22) PCT Filed: Jan. 6, 2005

(86) PCT No.: PCT/JP2005/000320

§ 371 (c)(1),
(2), (4) Date: May 30, 2006

(87) PCT Pub. No.: WO2005/067141

PCT Pub. Date: Jul. 21, 2005

(65) Prior Publication Data

US 2009/0108960 A1    Apr. 30, 2009

(30) Foreign Application Priority Data

Jan. 9, 2004    (JP)    ............................. 2004-003860

(51) Int. Cl.
   H03H 9/25    (2006.01)
   H03H 9/145   (2006.01)
   H03H 9/64    (2006.01)

(52) U.S. Cl. .................... 333/195; 333/193; 310/313 D

(58) Field of Classification Search ......... 333/193–196; 310/313 B, 313 D
See application file for complete search history.

(56) References Cited

U.S. PATENT DOCUMENTS 4,635,009 A * 1/1987 Ebata .......................... 333/195

(Continued)

FOREIGN PATENT DOCUMENTS

DE    41 26 335 A1 *  2/1993

(Continued)

*Primary Examiner*—Barbara Summons
(74) *Attorney, Agent, or Firm*—Wenderoth, Lind & Ponack, L.L.P.

(57) ABSTRACT

A surface acoustic wave resonator has a piezoelectric substrate (11), an IDT (13) formed of a plurality of electrode fingers (12) disposed on piezoelectric substrate (11), and reflectors (14) disposed near the opposite ends of IDT (13). The IDT (13) has a gradation region where the electrode finger pitch of the plurality of electrode fingers (12) at the opposite ends is different from the electrode finger pitch near the center of the IDT (13). In this gradation region, the electrode finger pitches are sequentially varied in the range from the electrode finger at the farthest end that is one end of the gradation region to the electrode finger lying at the other end of the gradation region. The electrode finger pitch of the electrode fingers at the farthest end that is one end of the gradation region is set to be 1 through 5% smaller than the electrode finger pitch near the center of the IDT (13).

6 Claims, 11 Drawing Sheets

U.S. PATENT DOCUMENTS

| | | | |
|---|---|---|---|
| 5,638,036 A * | 6/1997 | Penunuri et al. | 333/194 |
| 5,682,126 A * | 10/1997 | Plesski et al. | 333/193 |
| 6,420,946 B1 | 7/2002 | Bauer et al. | |
| 6,946,932 B2 * | 9/2005 | Takagi et al. | 333/195 |
| 7,042,132 B2 * | 5/2006 | Bauer et al. | 310/313 D |
| 7,304,553 B2 * | 12/2007 | Bauer et al. | 333/193 |
| 7,501,917 B2 * | 3/2009 | Nishimura et al. | 333/195 |

FOREIGN PATENT DOCUMENTS

| | | |
|---|---|---|
| DE | 101 11 959 A1 * | 9/2002 |
| JP | 61-142811 | 6/1986 |
| JP | 8-242140 | 9/1996 |
| JP | 10-242799 | 9/1998 |
| JP | 10-335966 * | 12/1998 |
| JP | 11-088112 | 3/1999 |
| JP | 2001-119260 | 4/2001 |
| JP | 2002-528987 | 9/2002 |
| WO | WO 03/081773 * | 10/2003 |

* cited by examiner

SURFACE ACOUSTIC WAVE RESONATOR, AND SURFACE ACOUSTIC WAVE FILTER

BACKGROUND OF THE INVENTION

1. Field of the Invention

The present invention relates to a surface acoustic wave resonator and surface acoustic wave filter for use in a portable phone.

2. Description of the Related Art

In a communication device such as a portable phone, a surface acoustic wave filter is used for extracting only a required frequency. Such a surface acoustic wave filter is required to have various characteristics corresponding to the communication device, such as a filter characteristic of low loss and broad band.

As a method of achieving the low loss and broad band filter characteristic, generally, a ladder-type surface acoustic wave filter where one-port resonators are disposed alternately in a series arm and a parallel arm is used. Such a surface acoustic wave filter generally has a structure shown in FIG. 19. In the surface acoustic wave filter shown in FIG. 19, two surface acoustic wave resonators 200 are connected to the series arm, and two surface acoustic wave resonators 300 are connected to the parallel arm, on the surface of piezoelectric substrate 100. Surface acoustic wave resonators 200 and 300 have a pair of inter-digital transducers (hereinafter referred to as "IDT") including a plurality of electrode fingers and reflectors disposed on opposite sides of the transducer. Comb electrodes of IDTs constituting surface acoustic wave resonators 200 of the series arm are connected to input-output terminals 410 and 420, respectively.

The frequency of the communication device, such as the portable phone employing such a surface acoustic wave filter, has increased, and a surface acoustic wave filter responsive to the increase is required. For responding to the increase in frequency, technology of decreasing the propagation loss using a 38° - 46° Y cut X propagation lithium tantalate (LiTaO$_3$) substrate as the piezoelectric substrate has been developed.

A CDMA (code division multiple access) system is employed as a modulation method in the portable phone, and suppression of a fine ripple in a pass band is required.

Japanese Patent Unexamined Publication No. 2001-119260 discloses a surface acoustic wave filter for suppressing a ripple. The surface acoustic wave filter has at least two surface acoustic wave resonators connected to a series arm and at least one surface acoustic wave resonator connected to a parallel arm, on the surface of the 38°-46° Y cut X propagation lithium tantalate (LiTaO$_3$) substrate. The surface acoustic wave resonators of the series arm have an excitation electrode formed of a plurality of electrode fingers. When the smallest number of electrode finger pairs of the surface acoustic wave resonators of this series arm is assumed to be N (N is a natural number), the number of electrode finger pairs in at least one of the surface acoustic wave resonators of the other series arm is set to be n×N (n is a natural number), namely different from N.

Thanks to this structure, a ripple caused by the surface acoustic wave resonator of the series arm having the smallest number of electrode finger pairs or the smallest number of reflecting electrodes can be cancelled by the surface acoustic wave resonator of the series arm where the number of electrode finger pairs or the number of reflecting electrodes is not a positive integral multiple.

In the surface acoustic wave filter disclosed by the above-mentioned document, the ripple is reduced as a whole by displacing the positions of the ripples of a plurality of series resonators. However, a ripple exists in each resonance characteristic, so that reduction of the ripples is restricted in this structure.

In the conventional general structure shown in FIG. 19, when the number of electrode finger pairs in a series resonator is reduced, the ripple in a pass band disadvantageously becomes large.

The present invention addresses the conventional problems, and provides a surface acoustic wave resonator and surface acoustic wave filter having a small ripple.

BRIEF SUMMARY OF THE INVENTION

A surface acoustic wave resonator of the present invention has a piezoelectric substrate, an IDT formed of a plurality of electrode fingers disposed on the surface of the piezoelectric substrate, and reflectors disposed near the opposite ends of the IDT. The IDT has a gradation region where the electrode finger pitch of the plurality of electrode fingers at opposite ends is different from the electrode finger pitch near the center of the IDT. In this gradation region, the electrode finger pitch of the electrode fingers at the farthest end, which is one end of the gradation region and the end of the IDT, is set to be 1 through 5% smaller than the electrode finger pitch near the center of the IDT. The electrode finger pitches are sequentially varied to gradually approach the electrode finger pitch near the center of the IDT, in the range from the electrode finger at the farthest end to the electrode finger lying at the other end of the gradation region and on the center side of the IDT.

In this structure, the number of electrode fingers in the gradation region may be set in response to the set value of the electrode finger pitch of the electrode fingers at the farthest end that is one end of the gradation region. The number of electrode fingers in the gradation region may be set to be 5 through 30.

This structure can provide a surface acoustic wave resonator with a small ripple.

The surface acoustic wave filter of the present invention is of a ladder type having a piezoelectric substrate and series resonators and parallel resonators that are interconnected on the surface of the piezoelectric substrate. One or more series resonators have the above-mentioned surface acoustic wave resonator. The following structure may be employed. The surface acoustic wave filter is of a ladder type having a piezoelectric substrate and series resonators and parallel resonators that are interconnected on the surface of the piezoelectric substrate. One or more series resonators and one or more parallel resonators have the surface acoustic wave resonator.

This structure can provide a ladder-type surface acoustic wave filter with a small ripple.

The surface acoustic wave filter of the present invention has a piezoelectric substrate, a plurality of IDTs disposed closely on the same surface acoustic wave propagation path on the piezoelectric substrate, and reflectors disposed on the opposite ends of the part having the plurality of IDTs. At least one of the plurality of IDTs is a first IDT connected to a signal path in series, and at least one of the plurality of IDTs is a second IDT connected between the signal path and the ground. The first IDT is formed of a plurality of electrode fingers, and has a gradation region where the electrode finger pitch of the plurality of electrode fingers at opposite ends is different from the electrode finger pitch near the center of the first IDT. In this gradation region, the electrode finger pitch of the electrode fingers at the farthest end, which is one end of the gradation region and the end of the first IDT, is set to be 1 through 5% smaller than the electrode finger pitch near the center of the first IDT. The electrode finger pitches are sequentially varied to gradually approach the electrode finger pitch near the center of the first IDT, in the range from the electrode finger at the farthest end to the electrode finger lying at the other end of the gradation region and on the center side of the first IDT.

In this structure, the second IDT may be formed of a plurality of electrode fingers, and has a gradation region where the electrode finger pitch of the plurality of electrode fingers at opposite ends is different from the electrode finger pitch near the center of the second IDT. In this gradation region, the electrode finger pitch of the electrode fingers at the farthest end, which is one end of the gradation region and the end of the second IDT, may be set to be 1 through 5% smaller than the electrode finger pitch near the center of the second IDT. The electrode finger pitches may be sequentially varied to gradually approach the electrode finger pitch near the center of the second IDT, in the range from the electrode finger at the farthest end to the electrode finger lying at the other end of the gradation region and on the center side of the second IDT.

This structure can provide an surface acoustic wave filter with a small ripple.

In the surface acoustic wave resonator and surface acoustic wave filter of the present invention, highly advantageously, even when the number of IDT pairs is reduced, forming of gradation regions at opposite ends can reduce the ripple, and can improve the characteristics of the surface acoustic wave resonator and surface acoustic wave filter.

DETAILED DESCRIPTION OF THE INVENTION

Embodiments of the present invention are described in detail hereinafter with reference to the accompanying drawings. The same elements are denoted with the same reference marks, and the descriptions of those elements are omitted. The following drawings are schematic, and do not accurately represent the number of electrode fingers and a pitch.

First Exemplary Embodiment

Figure 1:
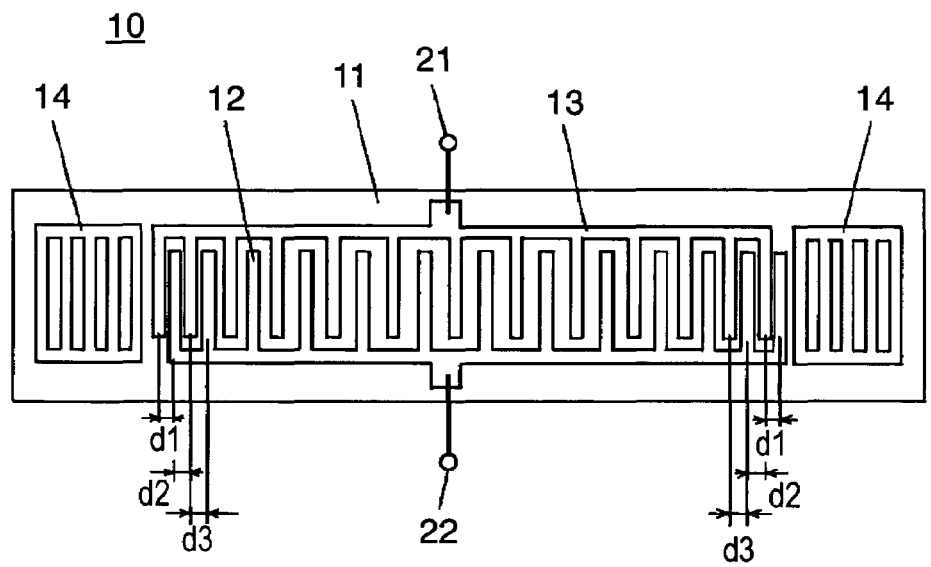
FIG. 1 is a plan view of a surface acoustic wave resonator in accordance with a first exemplary embodiment of the present invention.

FIG. 1 is a plan view of surface acoustic wave resonator 10 in accordance with a first exemplary embodiment of the present invention. Surface acoustic wave resonator 10 has the following elements:

IDT 13 including a plurality of electrode fingers 12 formed on the surface of piezoelectric substrate 11 made of 39° Y cut X propagation lithium tantalate ($LiTaO_3$); and reflectors 14 arranged near the opposite ends.

The electrode fingers 12 of IDT 13 are commonly interconnected to form a comb electrode, and are connected to input-output terminals 21 and 22.

In the present embodiment, the total number of electrode finger 12 pairs of IDT 13 is set at 90, namely the number of electrode fingers 12 is set at 180. The number of reflectors 14 is set at 40. The electrode finger pitch of IDT 13 is set at 2 μm near the center. In the present embodiment, 15 electrode fingers 12 at each end of IDT 13 have different electrode finger pitches. The electrode finger pitches of 15 electrode fingers 12 are varied as follows.

Figure 2:
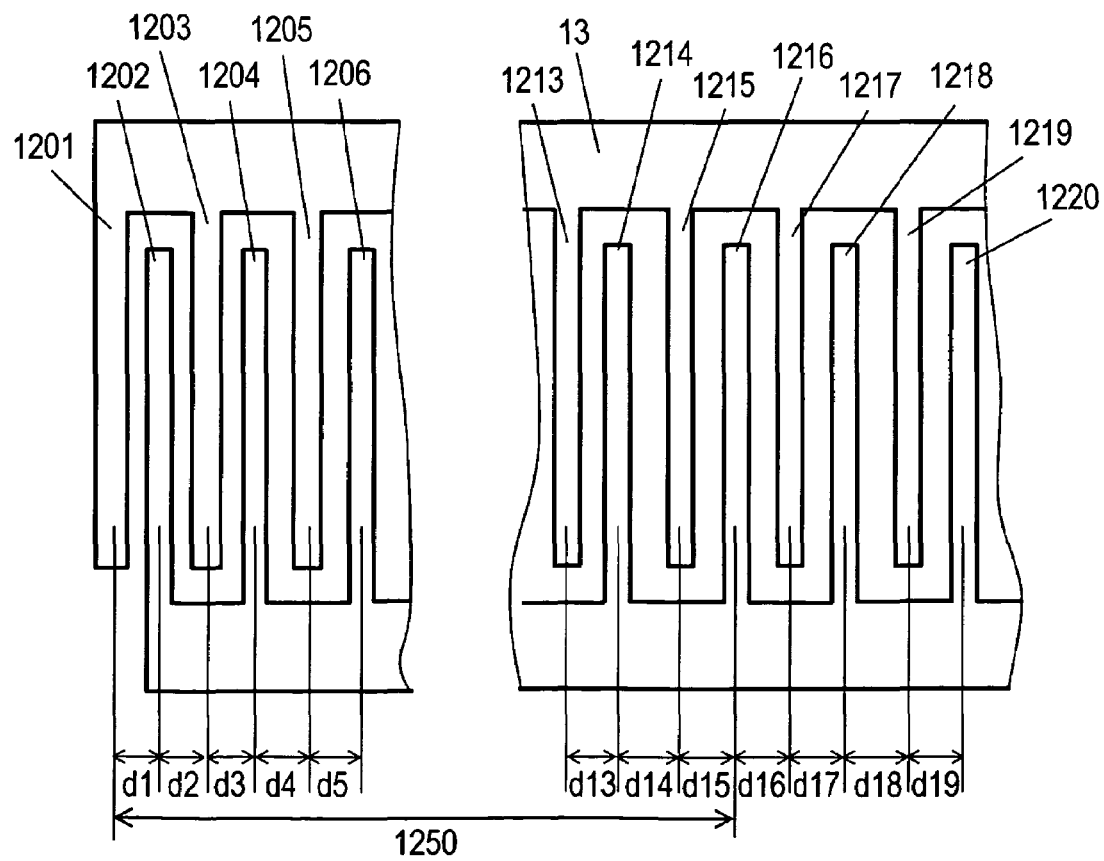
FIG. 2 is an enlarged view of the left end of an IDT shown in FIG. 1.

FIG. 2 is an enlarged view of the left end of IDT 13 shown in FIG. 1. The center distance between electrode finger 1201 at the farthest end nearest reflectors 14 and adjacent electrode finger 1202 is denoted with d1, the center distance between electrode finger 1202 and adjacent electrode finger 1203 is denoted with d2, the center distance between electrode finger 1203 and electrode finger 1204 is denoted with d3, and the center distances to 15th electrode finger 1215 are d4, d5, - - -, and d15. In the present embodiment, d1 is set to be 2% shorter than the electrode finger pitch, 2 μm, of the electrode fingers in the central region of IDT 13, the pitches until 15th electrode finger are linearly increased, and the pitches of 16th electrode finger and later are set at 2 μm. In other words, d1=1.96 μm, d2=1.9626 μm, d3=1.9653 μm, - - -, d15=1.9973 μm, and all of d16 and later are set at 2 μm. The right end of IDT 13 is set to have a similar structure, and IDT 13 is symmetric with respect to the center line. The range of electrode finger 1201 to electrode finger 1215 corresponding to the range of d1 to d15 is gradation region 1250. The electrode finger pitch of the farthest end is d1. The resonator having this structure is called a resonator of practical example 1.

A surface acoustic wave resonator that has a structure similar to that of the surface acoustic wave resonator shown in FIG. 1 but has identical electrode finger pitches in whole IDT 13 is used for comparison. This resonator is called a resonator of comparative example 1.

Figure 3:
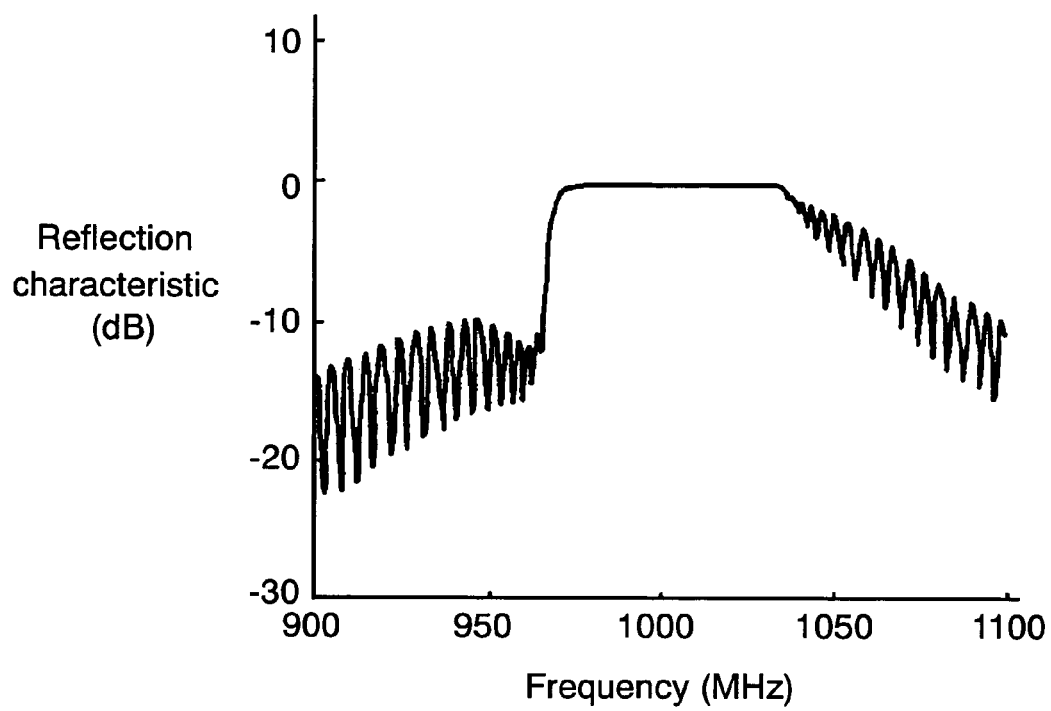
FIG. 3 is a diagram showing a simulation result of the reflection characteristic of the resonator of practical example 1, in the surface acoustic wave resonator of the first exemplary embodiment.
Figure 4:
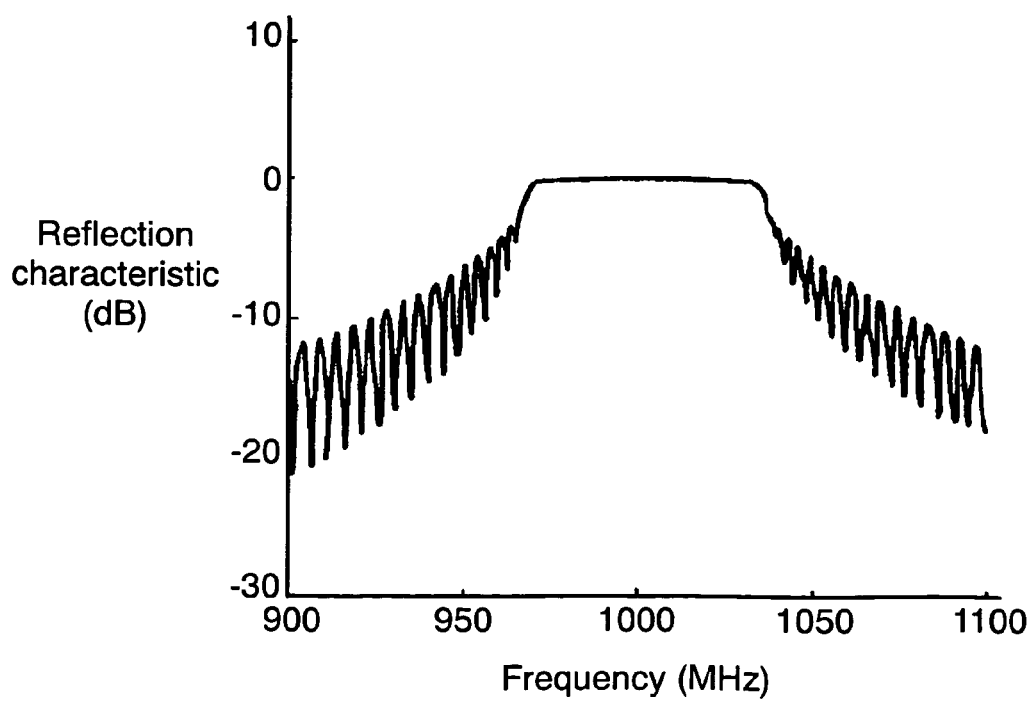
FIG. 4 is a diagram showing a simulation result of the reflection characteristic of the resonator of comparative example 1, in the surface acoustic wave resonator of the first exemplary embodiment.

FIG. 3 is a diagram showing a simulation result of the reflection characteristic of the resonator of practical example 1. FIG. 4 is a diagram showing a simulation result of the reflection characteristic of the resonator of comparative example 1. In each diagram, the vertical axis shows the reflection characteristic, and the horizontal axis shows the frequency.

As shown in FIG. 4, the resonator of comparative example 1 periodically has maximum reflection coefficients and minimum reflection coefficients outside the stop band. The frequency intervals between the maximum reflection coefficients and minimum reflection coefficients increase with decrease in number of electrode fingers, and differences between the maximum reflection coefficients and minimum reflection coefficients also increase with decrease in number of electrode fingers.

While, in the resonator of practical example 1, weighting is applied to the reflection characteristic, and the magnitude of the side lobe near the stop band on the lower frequency side is suppressed comparing with the resonator of comparative example 1.

Figure 5:
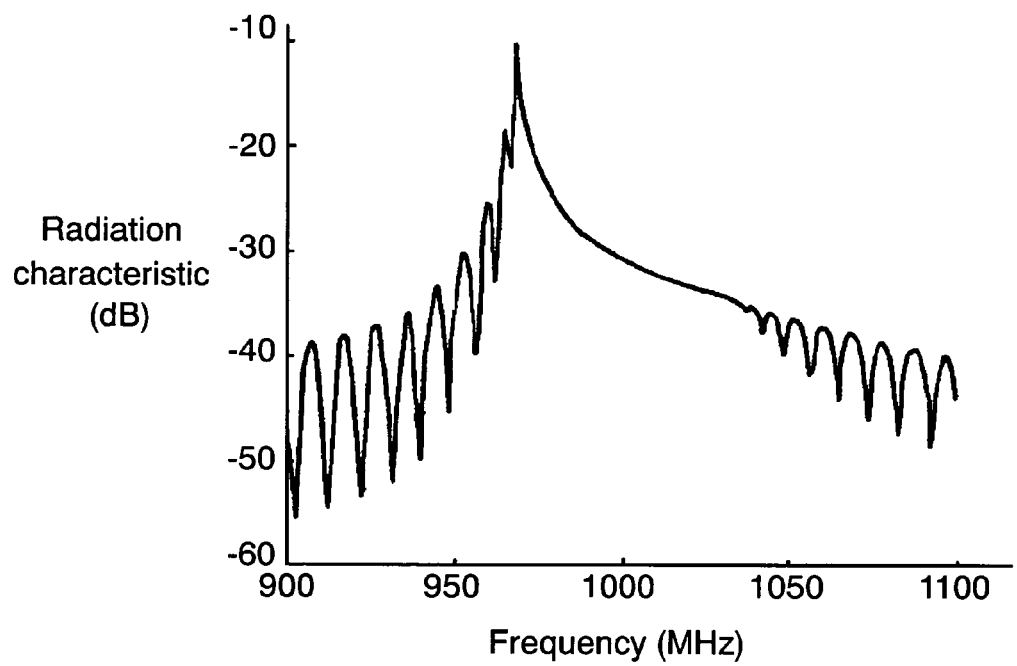
FIG. 5 is a diagram showing a simulation result of the radiation characteristic of the IDT of the resonator of practical example 1, in the surface acoustic wave resonator of the first exemplary embodiment.
Figure 6:
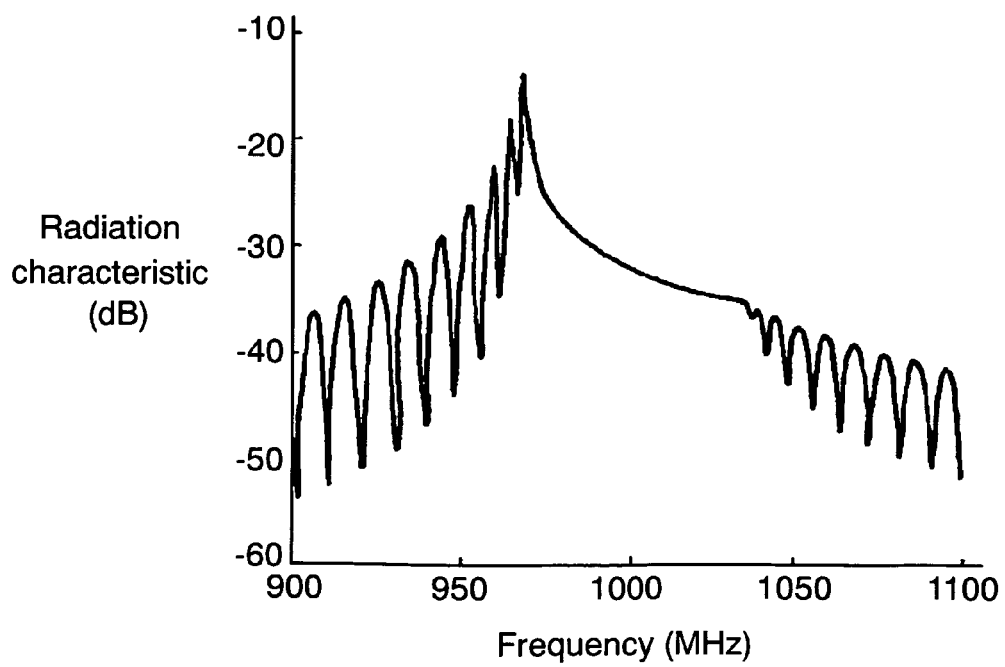
FIG. 6 is a diagram showing a simulation result of the radiation characteristic of the IDT of the resonator of comparative example 1, in the surface acoustic wave resonator of the first exemplary embodiment.

FIG. 5 is a diagram showing a simulation result of the radiation characteristic of the IDT of the resonator of practical example 1. FIG. 6 is a diagram showing a simulation result of the radiation characteristic of the IDT of the resonator of comparative example 1. In each diagram, the vertical axis shows the radiation characteristic, and the horizontal axis shows the frequency. The peak of the radiation characteristic is a resonance point. The resonator of practical example 1 has an improved radiation characteristic of the peak comparing with the resonator of comparative example 1. A plurality of maximum points occur on the side with frequency lower than that of the peak position, but the difference of the attenuation amount between the peak position as the resonance point and the maximum value adjacent to the peak position is larger in the resonator of practical example 1 than in that of comparative example 1.

Figure 7:
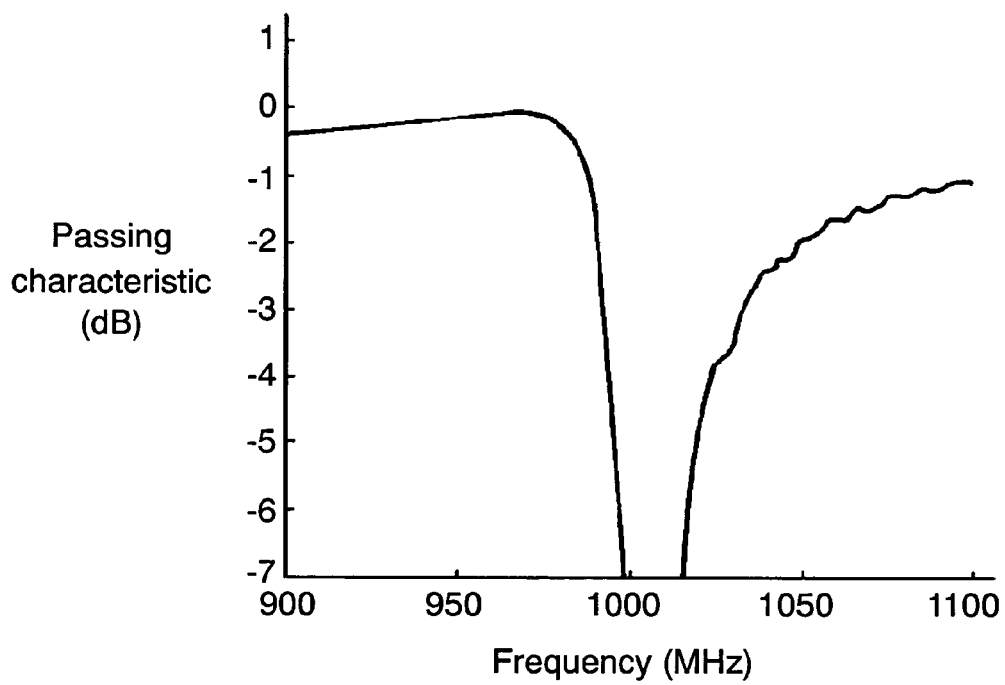
FIG. 7 is a diagram showing a simulation result of the transmitting characteristic of the resonator of practical example 1, in the surface acoustic wave resonator of the first exemplary embodiment.
Figure 8:
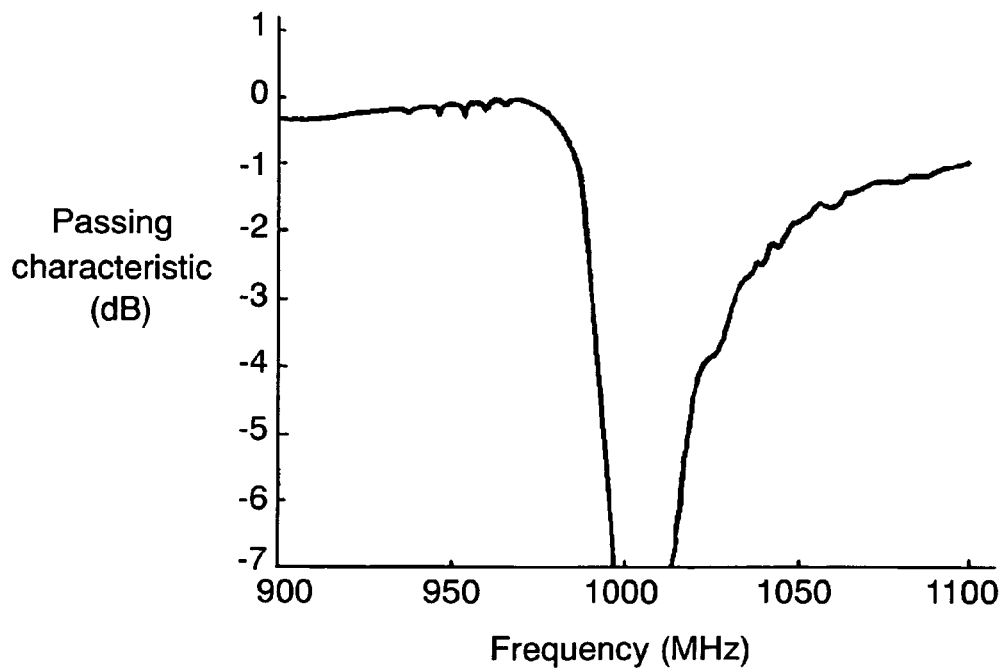
FIG. 8 is a diagram showing a simulation result of the transmitting characteristic of the resonator of comparative example 1, in the surface acoustic wave resonator of the first exemplary embodiment.

FIG. 7 is a diagram showing a simulation result of the transmitting characteristic of the resonator of practical example 1. FIG. 8 is a diagram showing a simulation result of the transmitting characteristic of the resonator of comparative example 1. In each diagram, the vertical axis shows the transmitting characteristic, and the horizontal axis shows the frequency.

In the resonator of comparative example 1 shown in FIG. 8, the transmitting characteristic has a ripple in the frequency region near the stop band of which frequency is lower than that of the resonance point. This ripple results from the reflection characteristic and radiation characteristic. This ripple of the transmitting characteristic is apt to increase in the region with frequency lower than that of the resonance point with decrease in number of the electrode finger pairs in the IDT.

While, in the resonator of practical example 1 shown in FIG. 7, the ripple hardly occurs in the transmitting characteristic, and a good characteristic is obtained.

Conventionally, apodization weighting is applied to the IDT of the surface acoustic wave resonator. However, the positions of electrode fingers are not varied by apodization weighting. Therefore, the reflection characteristic does not vary either, and hence the effect shown in the resonator of practical example 1 cannot be obtained.

In the resonator of practical example 1, the number of electrode fingers in the IDT is set at 180, and the electrode finger pitches of only 15 electrode fingers at each end are varied. For studying the effect in the case where the electrode finger pitches, namely the number of pairs, are varied, the similar simulation is applied to surface acoustic wave resonators having different numbers of electrode fingers in the IDT and different electrode finger pitches.

FIG. 9 through FIG. 12 show results of the ripples and losses obtained when the number of electrode fingers of the IDT is 100 and the number of electrode fingers in the gradation region at each end is varied in the surface acoustic wave resonator shown in FIG. 1. In FIG. 9 through FIG. 12, the variation in electrode finger pitch d1 of the electrode fingers at the farthest end that is one end of the gradation region shown in FIG. 1 is used as a parameter. As the ripple, the maximum value of the ripple occurring in the region where frequency is lower than that of the resonance point is determined. As the loss, a peak loss is determined. In each of FIG. 9 through FIG. 12, the left vertical axis shows the ripple, the right vertical axis shows the loss value, the horizontal axis shows the number of electrode fingers in the gradation region.

Figure 9:
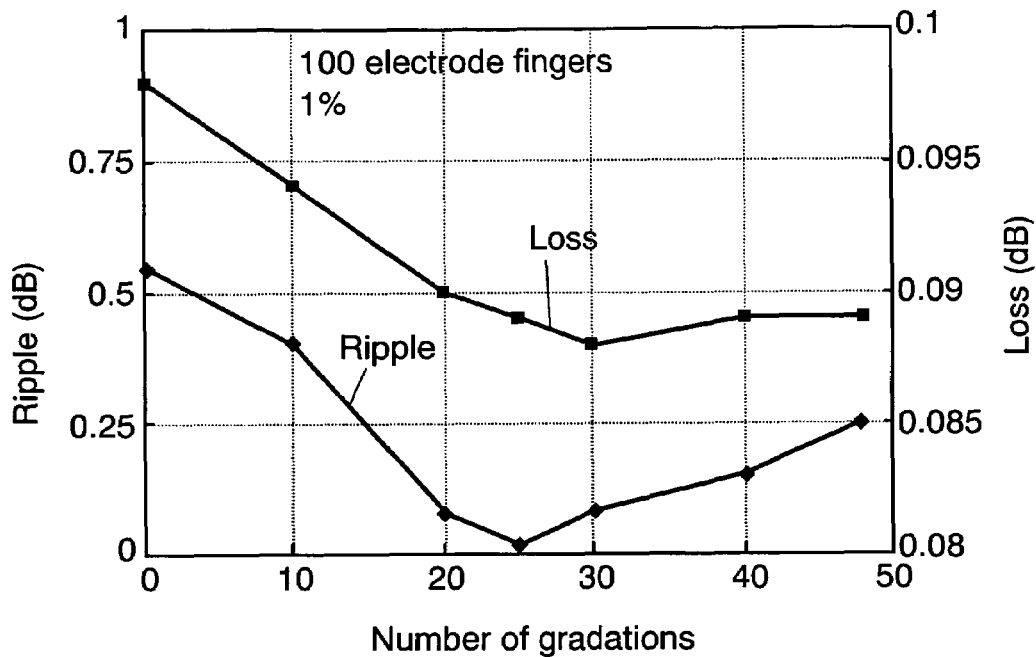
FIG. 9 is a diagram showing a result of the case where a ripple and loss are determined when the number of electrode fingers in the IDT is 100 and the number of electrode fingers in gradation regions at opposite ends is varied, and electrode finger pitch d1 at the farthest end is set to be 1% smaller than the electrode finger pitch near the center of the IDT, in the surface acoustic wave resonator of FIG. 1.

In FIG. 9, electrode finger pitch d1 at the farthest end is set to be 1% smaller than the electrode finger pitch near the center of the IDT. In this case, the electrode finger pitch in the gradation region is considered as discussed below. For example, when the number of electrode fingers is 20, electrode finger pitches d1 through d20 are varied linearly. The electrode finger pitches in the gradation region are varied linearly also in FIG. 10 through FIG. 12. When d1 is set to be 1% smaller than the electrode finger pitch near the center, the number of electrode fingers in the gradation region that minimizes the ripple is 25, and the ripple at this time is 0.002 dB. The number of electrode fingers that minimizes the loss is 30, and the loss value at this time is 0.088 dB.

Figure 10:
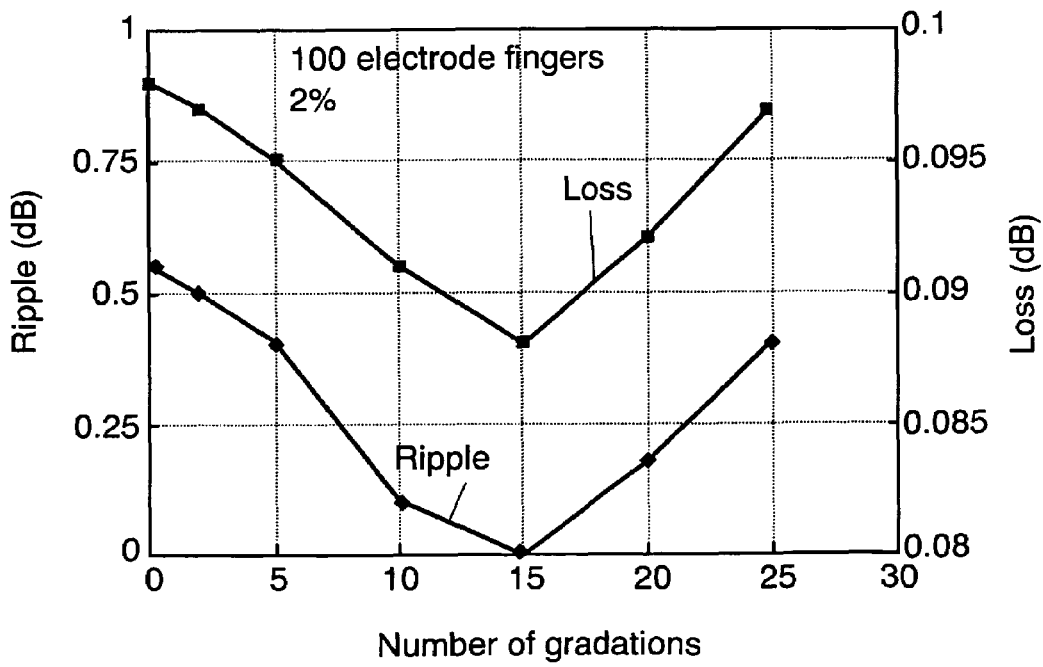
FIG. 10 is a diagram showing a result of the case similar to that of FIG. 9 where electrode finger pitch d1 at the farthest end is set to be 2% smaller than the electrode finger pitch near the center of the IDT.

In FIG. 10, electrode finger pitch d1 at the farthest end is set to be 2% smaller than the electrode finger pitch near the center of the IDT. When d1 is set to be 2% smaller than the electrode finger pitch near the center, the number of electrode fingers in the gradation region that minimizes the ripple is 15, and the ripple at this time is 0 dB. The number of electrode fingers that minimizes the loss is 15, namely equal to the number of electrode fingers that minimizes the ripple, and the loss value at this time is 0.088 dB.

Figure 11:
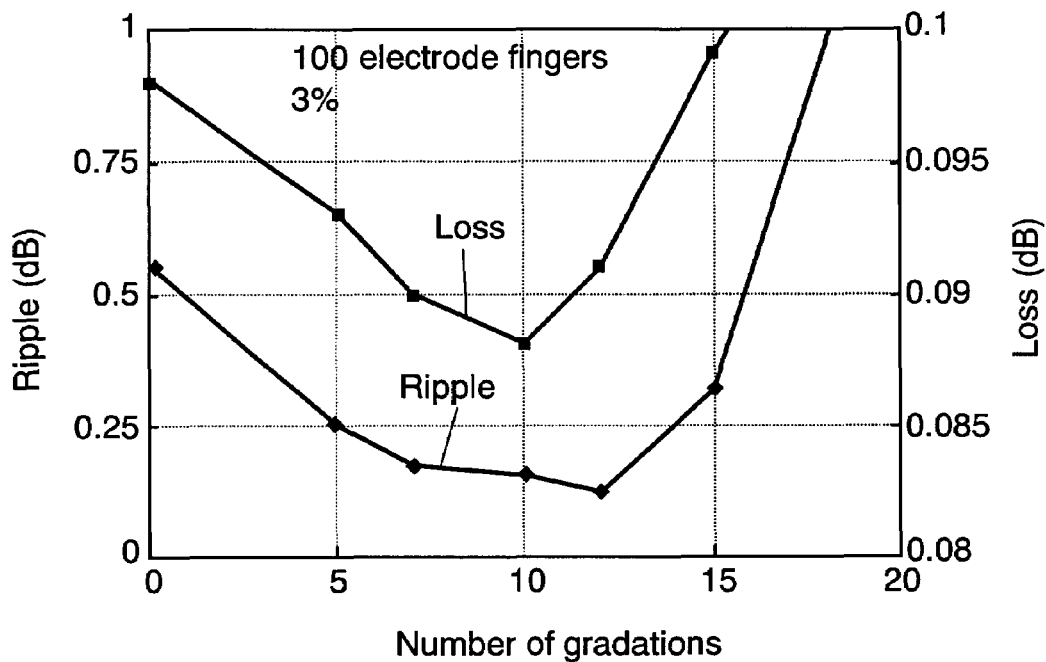
FIG. 11 is a diagram showing a result of the case similar to that of FIG. 9 where electrode finger pitch d1 at the farthest end is set to be 3% smaller than the electrode finger pitch near the center of the IDT.

In FIG. 11, electrode finger pitch d1 at the farthest end is set to be 3% smaller than the electrode finger pitch near the center of the IDT. When d1 is set to be 3% smaller than the electrode finger pitch near the center, the number of electrode fingers in the gradation region that minimizes the ripple is 12, and the ripple at this time is 0.12 dB. The number of electrode fingers that minimizes the loss is 10, and the loss value at this time is 0.088 dB. As shown in FIG. 11, when d1 is set at 3% smaller, the ripple and loss sharply increase with increase in number of electrode fingers in the gradation region.

Figure 12:
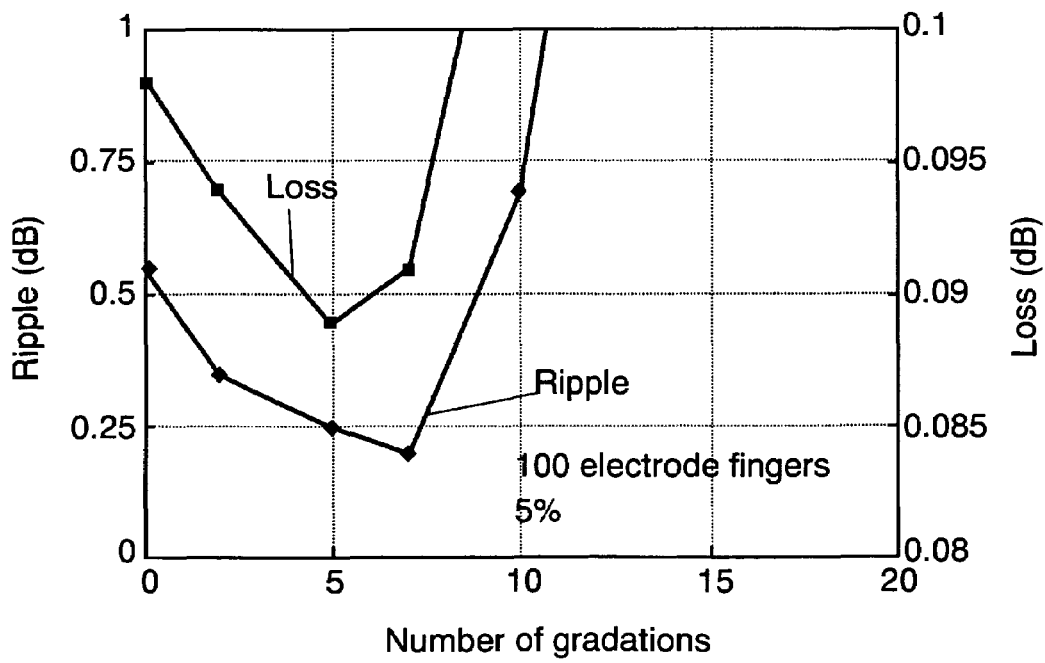
FIG. 12 is a diagram showing a result of the case similar to that of FIG. 9 where electrode finger pitch d1 at the farthest end is set to be 5% smaller than the electrode finger pitch near the center of the IDT.

In FIG. 12, electrode finger pitch d1 at the farthest end is set to be 5% smaller than the electrode finger pitch near the center of the IDT. When d1 is set to be 5% smaller than the electrode finger pitch near the center, the number of electrode fingers in the gradation region that minimizes the ripple is 7, and the ripple at this time is 0.2 dB. The number of electrode fingers that minimizes the loss is 5, and the loss value at this time is 0.089 dB. As shown in FIG. 12, when d1 is set at 5% smaller, the ripple and loss increase more sharply than those of FIG. 11 with increase in number of electrode fingers in the gradation region.

Thus, the optimal value of the number of electrode fingers in the gradation region depends on the set value of d1, but forming the gradation region can significantly reduce the ripple. Forming the gradation region can also reduce the loss.

Figure 13:
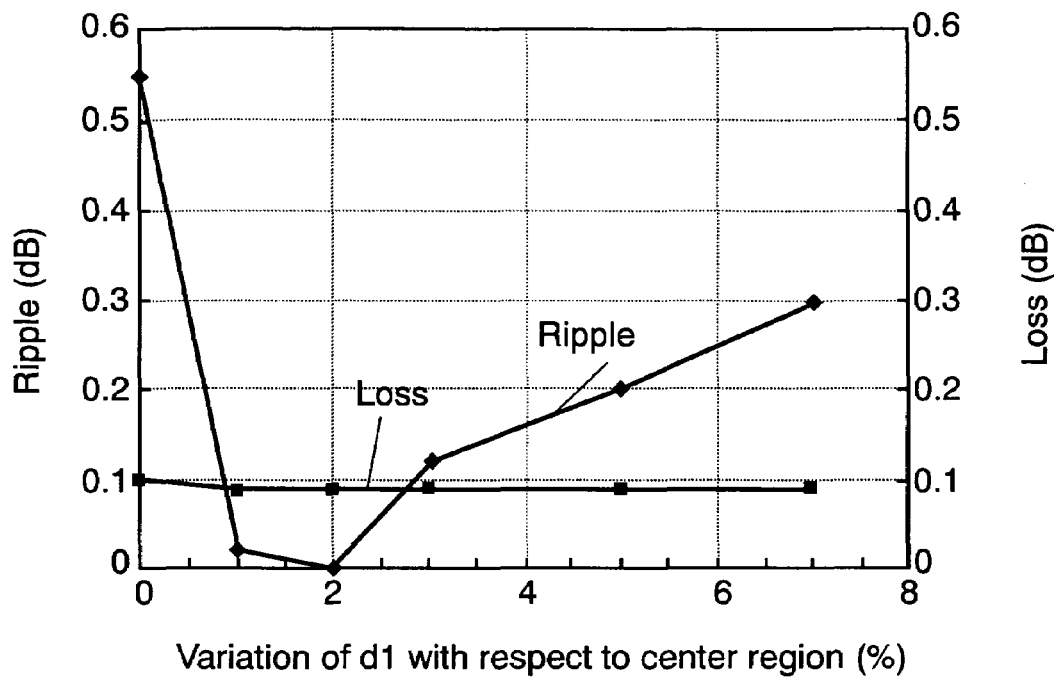
FIG. 13 is a diagram showing a result of the relation of the ripple and loss with the variation of electrode finger pitch d1 at the farthest end from the electrode finger pitch near the center of the IDT, based on the results of FIG. 9 through FIG. 12.

FIG. 13 shows the relation between the minimum values of the ripple and loss and the variation of electrode finger pitch d1 at the farthest end from the electrode finger pitch near the center of the IDT. Here, the relation in FIG. 13 is determined based on the results of FIG. 9 through FIG. 12, and includes additional data. The left vertical axis shows the ripple, the right vertical axis shows the loss, and the horizontal axis shows the variation of d1. For using the present resonator as the surface acoustic wave resonator or the surface acoustic wave filter, the ripple is required to be 0.25 dB or smaller. As shown in FIG. 13, for obtaining a ripple of the value or smaller, d1 must be 1 through 5%. For using the resonator for an application purpose such as CDMA system where even a small ripple presents a problem, d1 is more preferably set in the range of 1 to 3%.

Figure 14:
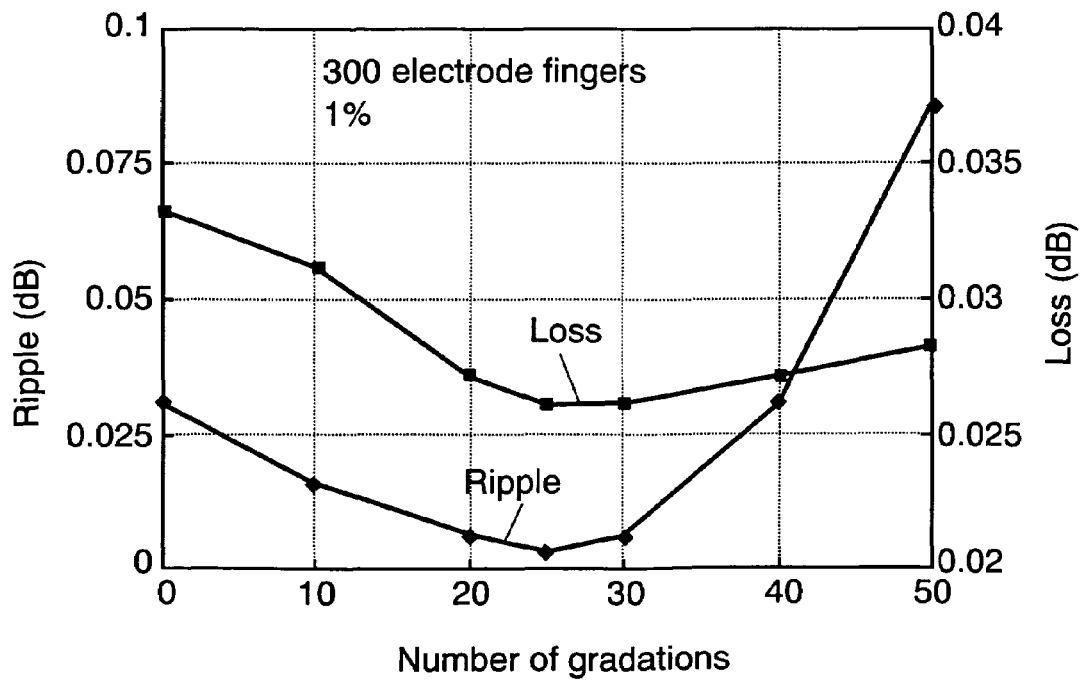
FIG. 14 through FIG. 16 are diagrams showing results of the ripple and loss determined when the number of electrode fingers in the IDT is 300 and the number of electrode fingers in the gradation regions at the opposite ends is varied, in the surface acoustic wave resonator of FIG. 1.
Figure 15:
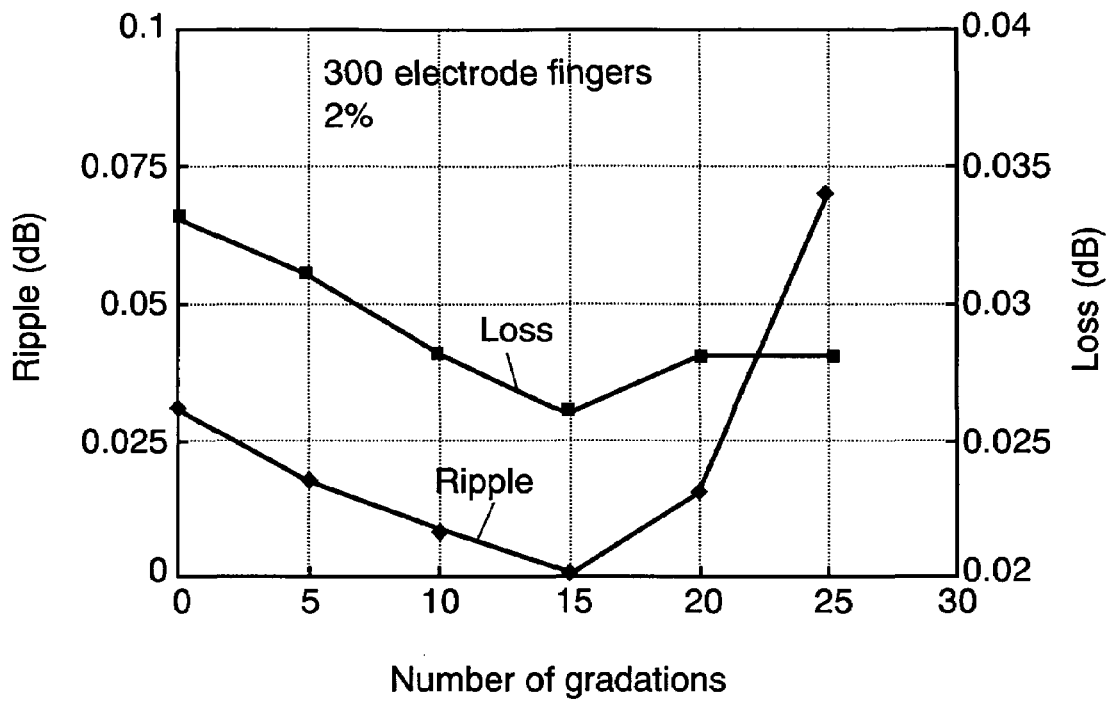
Figure 16:
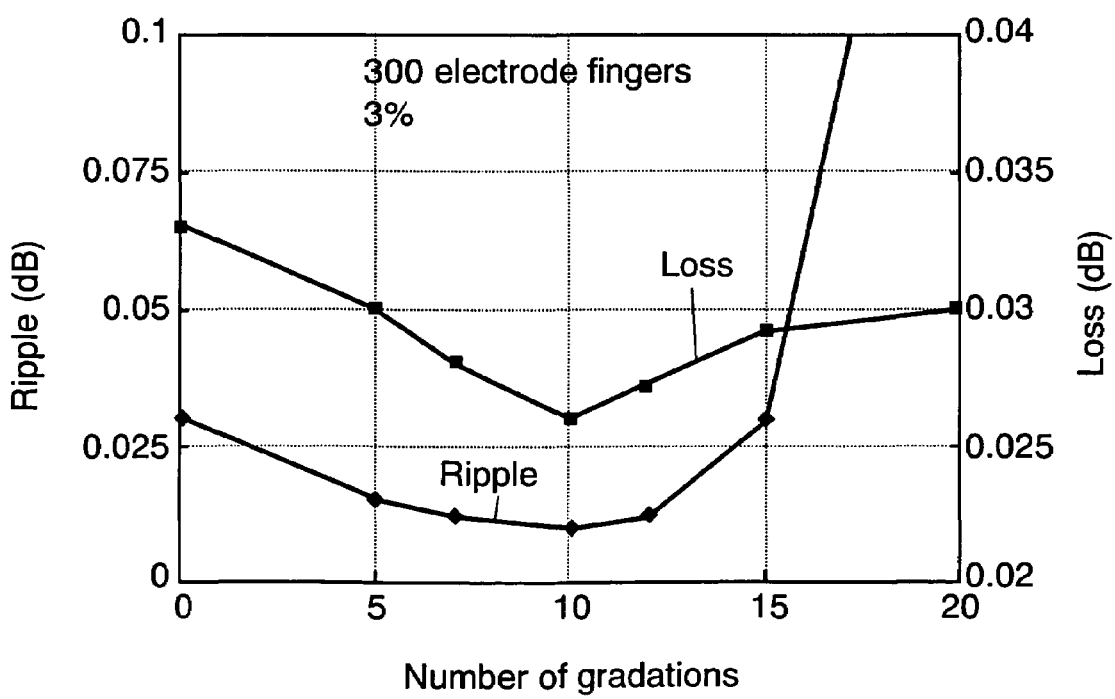

FIG. 14 through FIG. 16 show results of the ripples and losses determined when the number of electrode fingers in the IDT is 300 and the number of electrode fingers in the gradation region at each end is varied, in the surface acoustic wave resonator shown in FIG. 1. In FIG. 14 through FIG. 16, the variation in electrode finger pitch d1 at the farthest end lying at one end of the gradation region shown in FIG. 1 is used as a parameter. As shown in FIG. 9 through FIG. 11 and FIG. 14 through FIG. 16, the number of electrode fingers in the gradation region that minimizes the ripple is substantially the same whether the number of electrode fingers in the IDT is 100 or 300.

Based on the results, when the electrode finger pitches are sequentially varied, in the range from the electrode finger at the farthest end of the gradation region to the electrode finger lying at the end of the gradation region and on the central side of IDT, and the electrode finger pitch at the farthest end is set to be 1 through 5% smaller than the electrode finger pitch near the center in the IDT, the following result is produced. In other words, the number of electrode fingers in the gradation region that minimizes the ripple hardly affects the number of electrode fingers in the IDT. Therefore, even when the number of electrode finger pairs in the IDT is decreased, forming the gradation region can significantly reduce the ripple, and the present resonator can be used for a filter where the ripple especially presents a problem. Reducing the number of electrode finger pairs also can downsize the surface acoustic wave filter.

The resonance loss can be made smaller than that in the conventional structure by optimizing these conditions.

Even when the electrode finger pitches of the electrode fingers in the gradation region are varied in a different manner, a reduction effect of the ripple can be obtained. For example, even when the all pitches of 15 electrode fingers at each end are set to be 0.98 times larger than that near the center, the reduction effect of the ripple can be obtained. In such a structure, however, the insertion loss is apt to slightly increase. Therefore, it is more preferable to sequentially vary the pitches as discussed in the present embodiment.

Second Exemplary Embodiment

Figure 17:
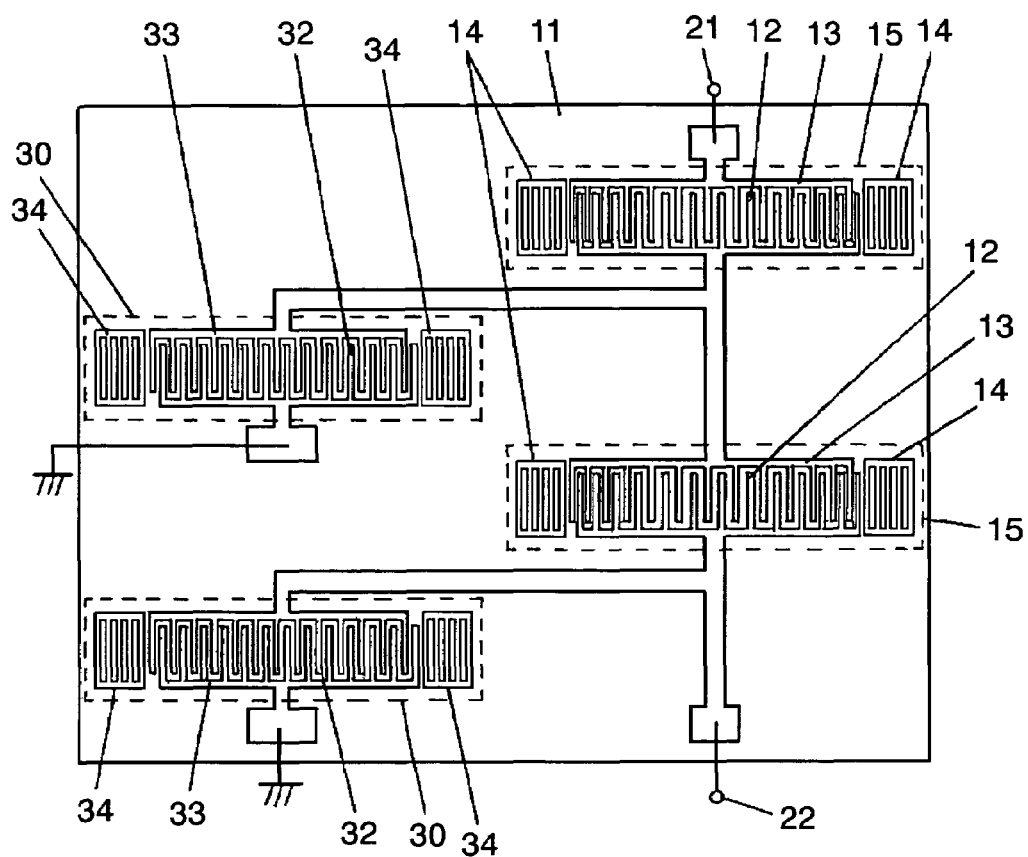
FIG. 17 is a plan view showing a structure of a surface acoustic wave filter in accordance with a second exemplary embodiment of the present invention.

FIG. 17 is a plan view showing a structure of a surface acoustic wave filter in accordance with a second exemplary embodiment of the present invention. In the present exemplary embodiment, a ladder-type surface acoustic wave filter is formed using the surface acoustic wave resonator of the first exemplary embodiment.

In FIG. 17, the ladder-type surface acoustic wave filter is formed in the following structure. Two series resonators 15 and two parallel resonators 30 that have an electrode thickness of about 0.4 μm are disposed on piezoelectric substrate 11 made of 39° Y cut X propagation lithium tantalate (LiTaO$_3$) as shown in FIG. 17. The series and parallel resonators are interconnected by electrode wiring. Each series resonator 15 is formed of IDT 13 including a plurality of electrode fingers 12 and reflectors 14 disposed near the opposite ends of IDT 13. Each parallel resonator 30 is formed of IDT 33 including a plurality of electrode fingers 32 and reflectors 34 disposed near the opposite ends of IDT 33.

In series resonator 15, the number of electrode finger pairs in the IDT is set at 90, the electrode finger pitch near the center is set at about 2.34 μm, and gradation regions are disposed at opposite ends of IDT 13 similarly to FIG. 1. In the present embodiment, the electrode finger pitch of the electrode fingers at the farthest end, namely each end of IDT 13, is set at about 2.29 μm, electrode finger pitches are gradually increased in the direction to the center side, and the 16th electrode finger pitch is equal to the electrode finger pitch near the center. In parallel resonator 30, the number of electrode finger pairs in the IDT is set at 130, the electrode finger pitch is set at about 2.44 μm, and no gradation region is disposed.

As shown in the first embodiment, a large ripple is apt to appear in the region with frequency lower than that of the resonance point, so that a ripple of series resonator 15 appears in the pass band when the ladder-type surface acoustic wave filter is formed. Therefore, as shown in the present embodiment, the ripple can be reduced in the pass band by forming gradation regions at the opposite ends of IDT 13 of series resonator 15.

Both of two series resonators have a gradation region in the present embodiment. However, all series resonators are not required to have a gradation region. However, it is preferable to form gradation regions in all series resonators, because the ripple can be further reduced. When there are a plurality of series resonators and each resonator has a different number of electrode finger pairs in each IDT, it is preferable to form a gradation region especially in the resonator having a small number of IDT pairs.

Parallel resonators 30 do not affect the ripple in the pass band, but can reduce resonance loss of the parallel resonators 30 if they have a gradation region. Therefore, when a low-pass side attenuation amount is especially required as a filter characteristic, it is preferable to form gradation regions in parallel resonators 30.

Third Exemplary Embodiment

Figure 18:
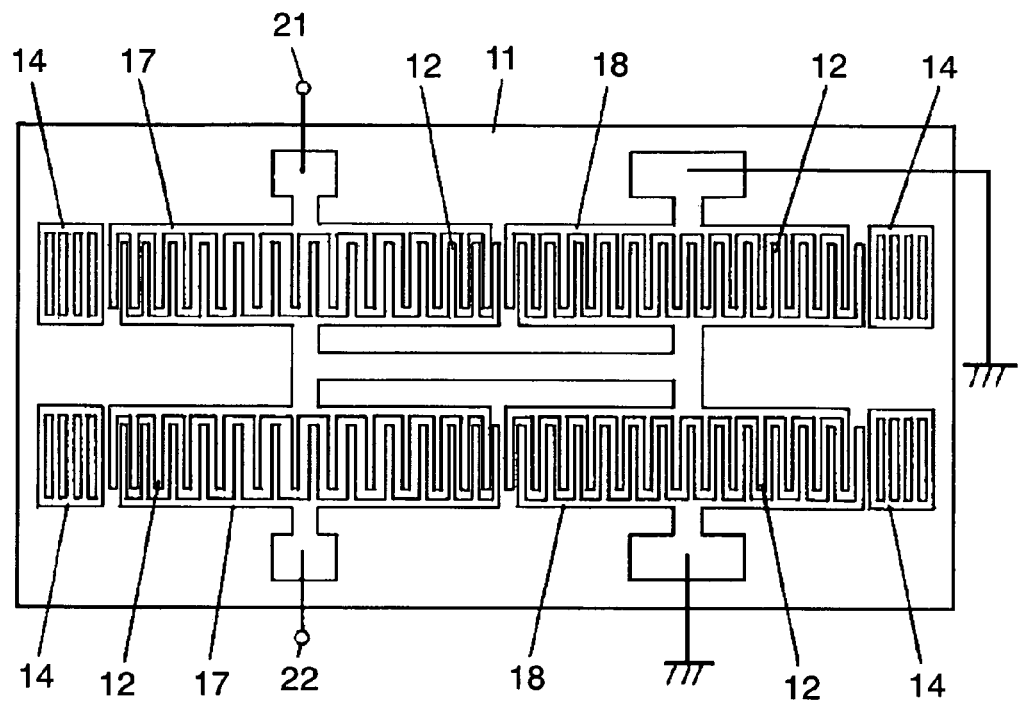
FIG. 18 is a plan view showing a structure of a surface acoustic wave filter in accordance with a third exemplary embodiment of the present invention.
Figure 19:
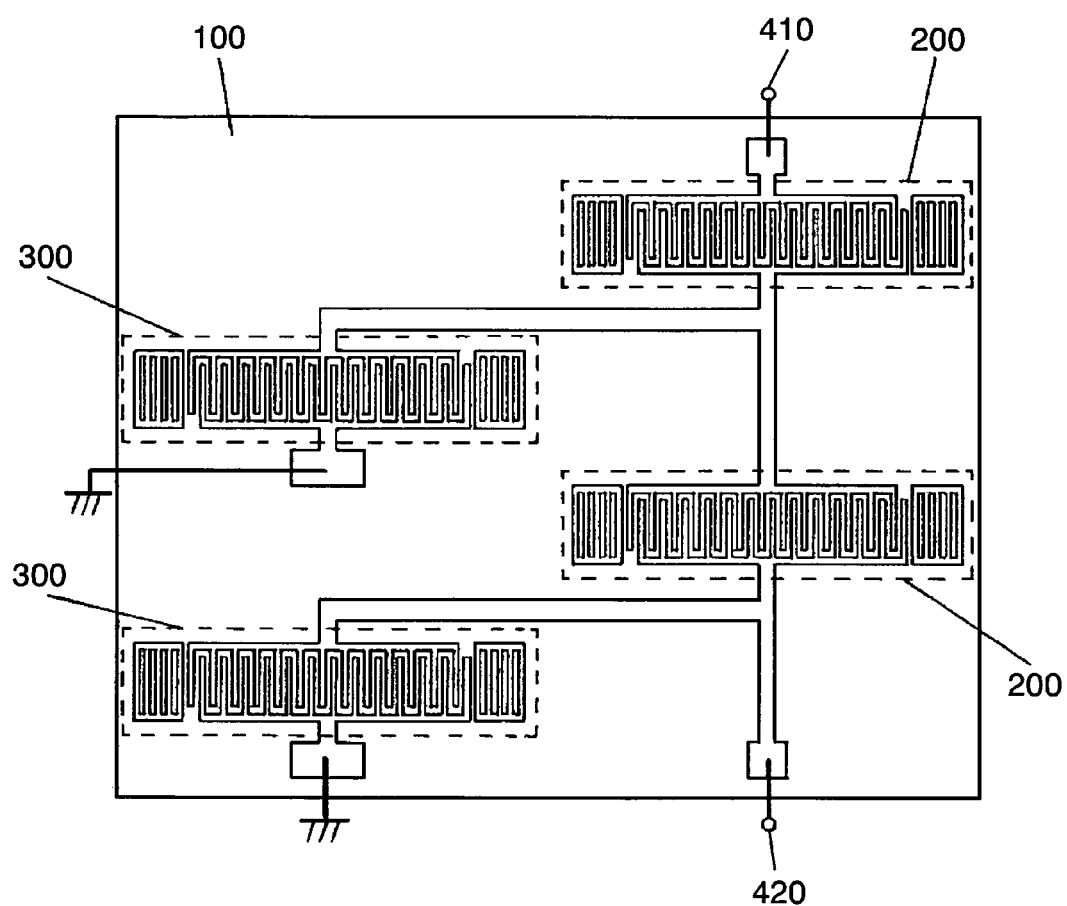
FIG. 19 is a view showing a ladder-type surface acoustic wave filter with a conventional structure where one-port resonators are alternately arranged in a series arm and a parallel arm.

FIG. 18 is a plan view showing a structure of a surface acoustic wave filter in accordance with a third exemplary embodiment of the present invention. The surface acoustic wave filter of the present exemplary embodiment employs a multi-port surface acoustic wave resonator. Here, the second exemplary embodiment has provided the ladder-type surface acoustic wave filter employing a one-terminal-pair surface acoustic wave resonator.

The surface acoustic wave filter of the present exemplary embodiment is shown in FIG. 18. First IDT 17 and second IDT 18 having an electrode thickness of about 0.4 µm are disposed on piezoelectric substrate 11 made of 39° Y cut X propagation lithium tantalate (LiTaO$_3$). Reflectors 14 are disposed near the opposite ends of the part having first IDT 17 and second IDT 18. Two products with this structure are disposed.

First IDTs 17 are disposed and interconnected in series in a signal path between two input-output terminals 21 and 22. Second IDTs 18 are disposed and interconnected between the signal path and the ground. In each first IDT 17, the number of electrode finger pairs is set at 90, the electrode finger pitch near the center is set at about 2.34 µm, and gradation regions are disposed at the opposite ends thereof The electrode finger pitch of the electrode fingers at the farthest end of the gradation region is set at about 2.29 µm, electrode finger pitches are gradually increased in the direction to the center side, and the 16th electrode finger pitch is equal to the electrode finger pitch near the center. In each second IDT 18, the number of electrode finger pairs is set at 130, the electrode finger pitch is set at about 2.44 µm, and no gradation region is disposed.

In the multi-port surface acoustic wave resonator having such a structure, the reflection characteristics and radiation characteristics of the IDTs themselves are the same as those of the second embodiment, so that the ripple in the pass band can be significantly suppressed similarly to the second embodiment.

One first IDT 17 and one second IDT 18 are disposed in one resonator in the present embodiment; however, the present invention is not limited to this. A plurality of IDTs may be disposed in only one resonator or both resonators. A reflector may be disposed between first IDT 17 and second IDT 18.

A surface acoustic wave resonator and surface acoustic wave filter of the present invention have the effect of reducing the ripple, and are used as a filter in a communication field such as portable phones or in a video field such as televisions.

REFERENCE MARKS IN THE DRAWINGS

10, 200, 300 Surface acoustic wave resonators
11, 100 Piezoelectric substrates
12, 1201, 1202, 1203, 1204, 1205, 1206, 1213, 1214, 1215, 1216, 1217
1218, 1219, 1220 Electrode fingers
13 IDT
14 Reflector
15 Series resonator
16 Parallel resonator
17 First IDT
18 Second IDT
21, 22, 410, 420 Input-output terminals
1250 Gradation region

The invention claimed is:

1. A surface acoustic wave resonator comprising:
a piezoelectric substrate;
an inter-digital transducer formed of two electrodes including a plurality of electrode fingers disposed on a surface of the piezoelectric substrate, the inter-digital transducer including a gradation region located at opposing ends thereof; and
reflectors disposed near the opposing ends of the inter-digital transducer,
wherein the gradation region includes electrode fingers of the plurality of electrode fingers, the electrode fingers included in the gradation region having an electrode finger pitch that gradually changes,
wherein, at each opposing end of the inter-digital transducer and within the gradation region, the electrode finger pitch of 5 to 30 electrode fingers of the plurality of electrode fingers is different from the electrode finger pitch of electrode fingers of the plurality of electrode fingers located near a center of the inter-digital transducer,
wherein the electrode finger pitch of electrode fingers of the plurality of electrode fingers located at a farthest end, which is one end of the gradation region and one of the opposing ends of the inter-digital transducer, is set to be 1% to 5% smaller than the electrode finger pitch of the electrode fingers located near the center of the inter-digital transducer, and
wherein, within the gradation region, the electrode finger pitch is sequentially varied from the electrode finger pitch of an electrode finger of the plurality of electrode fingers located at the farthest end to gradually approach the electrode finger pitch of the electrode fingers located near the center of the inter-digital transducer, and is sequentially varied from the electrode finger pitch of an electrode finger of the plurality of electrode fingers located at an end of the inter-digital transducer that is opposite from the farthest end to gradually approach the electrode finger pitch of the electrode fingers located near the center of the inter-digital transducer.

2. The surface acoustic wave resonator of claim 1, wherein a number of the electrode fingers in the gradation region is set to depend on a set value of the electrode finger pitch of the electrode finger at the farthest end.

3. A ladder-type surface acoustic wave filter comprising:
a piezoelectric substrate; and
series resonators and parallel resonators that are interconnected on the surface of the piezoelectric substrate,
wherein one or more of the series resonators is the surface acoustic wave resonator of claim 1.

4. A ladder-type surface acoustic wave filter comprising:
a piezoelectric substrate; and
series resonators and parallel resonators that are interconnected on the surface of the piezoelectric substrate,
wherein one or more of the series resonators and one or more of the parallel resonators are the surface acoustic wave resonator of claim 1.

5. A surface acoustic wave filter comprising:
a piezoelectric substrate;
a plurality of inter-digital transducers disposed closely on an identical surface acoustic wave propagation path on the piezoelectric substrate; and
reflectors disposed on opposite ends of a structure including the plurality of inter-digital transducers,
wherein at least one of the plurality of inter-digital transducers is a first inter-digital transducer connected to a signal path in series, and at least one of the plurality of inter-digital transducers is a second inter-digital transducer connected between the signal path and a ground, wherein the first inter-digital transducer is formed of two electrodes including a plurality of electrode fingers, and the first inter-digital transducer includes-has a gradation region located at opposing ends thereof, wherein the gradation region includes electrode fingers of the plurality of electrode fingers, the electrode fingers included in the gradation region having an electrode finger pitch that gradually changes, wherein, at each opposing end of the first inter-digital transducer and within the gradation region, the electrode finger pitch of 5 to 30 electrode fingers of the plurality of electrode fingers is different from the electrode finger pitch of electrode fingers of the plurality of electrode fingers located near a center of the first inter-digital transducer, wherein the electrode finger pitch of electrode fingers of the plurality of electrode fingers located at a farthest end, which is one end of the gradation region and one of the opposing ends of the first inter-digital transducer, is set to be 1% to 5% smaller than the electrode finger pitch of the electrode fingers located near the center of the first inter-digital transducer, and wherein, within the gradation region, the electrode finger pitch is sequentially varied from the electrode finger pitch of an electrode finger of the plurality of electrode fingers located at the farthest end to gradually approach the electrode finger pitch of the electrode fingers located near the center of the first inter-digital transducer, and is sequentially varied from the electrode finger pitch of an electrode finger of the plurality of electrode fingers located at an end of the first inter-digital transducer that is opposite from the farthest end to gradually approach the electrode finger pitch of the electrode fingers located near the center of the first inter-digital transducer.

6. The surface acoustic wave filter of claim 5, wherein the second inter-digital transducer is formed of two electrodes including a plurality of electrode fingers, and the second inter-digital transducer includes a second gradation region located at opposing ends thereof, wherein the second gradation region of the second inter-digital transducer includes electrode fingers of the plurality of electrode fingers of the second inter-digital transducer, the electrode fingers included in the second gradation region having an electrode finger pitch that gradually changes, wherein, at each opposing end of the second inter-digital transducer and within the second gradation region, the electrode finger pitch of 5 to 30 electrode fingers of the plurality of electrode fingers is different from the electrode finger pitch of electrode fingers of the plurality of electrode fingers located near a center of the second inter-digital transducer, wherein, within the second gradation region, the electrode finger pitch of electrode fingers of the plurality of electrode fingers located at a farthest end, which is one end of the second gradation region and one of the opposing ends of the second inter-digital transducer, is set to be 1% to 5% smaller than the electrode finger pitch of the electrode fingers located near the center of the second inter-digital transducer, and wherein, within the second gradation region, the electrode finger pitch is sequentially varied from the electrode finger pitch of an electrode finger of the plurality of electrode fingers of the second inter-digital transducer located at the farthest end to gradually approach the electrode finger pitch of the electrode fingers located near the center of the second inter-digital transducer, and is sequentially varied from the electrode finger pitch of an electrode finger of the plurality of electrode fingers of the second inter-digital transducer located at an end of the second inter-digital transducer that is opposite from the farthest end to gradually approach the electrode finger pitch of the electrode fingers located near the center of the second inter-digital transducer.

* * * * *